United States Patent [19]

Kelly

[11] 4,173,213
[45] Nov. 6, 1979

[54] SOLAR POWER SYSTEM, WITH HIGH CONCENTRATION, LINEAR REFLECTIVE SOLAR PANELS

[76] Inventor: Donald A. Kelly, 58-06 69th Pl., Maspeth, N.Y. 11378

[21] Appl. No.: 723,501

[22] Filed: Sep. 15, 1976

[51] Int. Cl.² .................................................. F24J 3/02
[52] U.S. Cl. ...................................... 126/425; 60/641; 237/1 A; 126/438; 126/451
[58] Field of Search ............... 126/270, 271; 237/1 A; 60/641

[56] References Cited

U.S. PATENT DOCUMENTS

| | | | |
|---|---|---|---|
| 980,505 | 1/1911 | Emmet | 126/271 |
| 1,162,505 | 11/1915 | Nichols | 126/271 |
| 1,683,266 | 9/1928 | Shipman | 126/271 |
| 1,704,173 | 3/1929 | Chesney | 126/271 |
| 1,946,184 | 2/1934 | Abbot | 126/271 |
| 3,217,702 | 11/1965 | Miller | 126/270 |
| 3,976,508 | 8/1976 | Mlavsky | 126/271 |
| 3,988,166 | 10/1976 | Beam | 126/271 |

*Primary Examiner*—Samuel Scott
*Assistant Examiner*—Larry Jones

[57] ABSTRACT

The solar power system with high concentration linear reflective solar panels of the linear parabolic type is intended to increase the electrical power output from conventional silicon solar cells, and heat water for steam power.

Circular parabolic reflectors have been used for this purpose but there are not as flexible in application as the linear parabolic reflectors (L. P. R.'s).

The solar power system may be arranged as an all electric type using continuous lines of silicon solar cells located at the apex or focal zone of the parabola, or may be designed as a dual solar conversion system with both solar photoelectric means and a water heating steam means, as an indirect or secondary power source.

The key feature of the system is the geometric configuration of the linear parabolic reflectors (L. P. R.'s), with an unusually high reflective concentration ratio of 10:1 minimum, plus boosters, and the connection of these pivoted linear panels to a common oscillating linkage and timing unit for full sun following capability to maintain optimum direct solar exposure each day.

8 Claims, 6 Drawing Figures

SOLAR POWER SYSTEM, WITH HIGH CONCENTRATION, LINEAR REFLECTIVE SOLAR PANELS

BACKGROUND OF THE INVENTION

The present state of the art in silicon photovoltaic solar cells is far from encouraging on the basis of electrical power output per unit cell cost. Present costs run at about $25 per watt in quantity, and about $40 per watt in single packaged assemblies, which is prohibitably high for any commercial or household direct power conversion installation.

It is quite unlikely that the future cost of the silicon photovoltaic solar cell can be substantially reduced because of the basic material processing and fabrication techniques involved. Only a very large and steady market demand can eventually lower the costs appreciably, which will be impossible to achieve, quickly from the present very high cost levels.

Some progress is now being made in the development of direct solar conversion systems using conventional silicon solar cells receiving concentrated solar rays to increase the photo light intensity and thereby the power output, but this arrangement using circular parabolic reflectors is made complex by a liquid cooling adaptation requirement and the bulkiness of the equipment.

It appears that this approach to increasing the electrical power output of each solar cell is practical and has cost reduction merit, provided that the light heat level received by the solar cell is kept equal to, or slightly below, the optimum exposure levels of the specific solar cell, so that the cell life span is not adversely affected, and the direct conversion geometry and means kept as simple and inexpensive as possible.

It is believed that the presently advocated direct solar conversion arrangement, using linear parabolic reflectors (L.P.R's) will ideally meet the functional requirements as previously described. The linear parabolic reflectors (L.P.R.) is considerably less expensive to produce than a corresponding circular parabolic reflector because of the simple linear, uniform geometry involved, and simplified production forms and techniques.

The circular dish parabolic reflector produces a very hot "spot", concentration area for a relatively large collection exposed surface area, while the linear parabolic reflector produces a moderately hot "strip" concentration area for a relatively smaller collection surface area.

The circular parabolic reflector arrangement has the advantage of requiring a minimum number of solar cells for a system which will require a very large total exposure surface area for nearly full house-power requirements, while the linear parabolic ic reflector configuration has a decided advantage for a dual, direct electric and indirect hot-water steam solar conversion system. The moderately hot 250 degrees to 300 degrees F. temperature level "strip" of the linear parabolic reflector is ideal for the dual solar conversion means, where both a continuous line of solar cells and parallel, "piggy-back" flash boiler pipe can be uniformly exposed to an approximate 16:1 concentration of solar rays.

A direct solar conversion arrangement using the circular type of parabolic reflector has a cost projection which is still prohibitively high for a wide market acceptance, in the ($5000 to $7000) price range for approximately half the average house power requirements (6 KW/hr.) It is projected that this present arrangement can produce equivalent KW output performance at a present cost of between ($3500-$4500) for a one-family house, or full average housepower (12 KW/hr), at an equivalent present cost to the prior solar power system.

Most of the basic water heating components of the solar power system are not new or novel, and are now in use in several solar water heating and direct conversion installations, with the exception of the unique high concentration type of linear parabolic reflectors (L.P.R.'s), which are a new innovation in the art.

Linear parabolic reflectors (L.P.R.'s) have been used in the past with a concentration ratio of about 5:1, in successful water-pumping irrigation projects, in which the heated water-to-steam produced drove a large steam engine water pump. The Nile River water pumping irrigation system utilized relatively large diameter pipe and L.P.R.'s to heat the river water to steam sufficient to drive a 50 hp steam engine.

Because of the current necessity of limiting the exposure area for house power applications, the circulating water must be preheated in several conventional water heating units to about 135 degrees F. before entrance into the multiple, parallel flash boiler pips. For a practical steam horsepower rating of about 10-15 hp, it is desirable to use multiple small diameter pipes rather than a single large pipe size for the flash boiler pipe installation, since both the L.P.R.'s and solar exposure area can be adapted to match the roof area of the average one-family house. Excessively large L.P.R.'s are not desirable, since they are vunerable to wind and storm damage and subsequent repair and servicing.

Conventional shallow "dish" cross-section L.P.R.'s reflect and concentrate solar rays at the central linear apex or focal line, and are therefore limited in the amount of solar ray concentration that can be realized. In addition, the generally short height cross-section of the conventional L.P.R.'s is not structurally rigid over long distances (poor section modulus), making it necessary to provide a substantial backing for structural reinforcement, for sun-following oscillation installations.

The present high concentration type of L.P.R. cross-section configuration is aimed at improving both of these features, the concentration ratio and section modulus, so that optimum concentration and structural stiffness will be achieved.

These desirable results are gained by adding extra concave reflector sections to the basic lower parabolic cross-section, above the focal line of the basic parabolic reflector section. Another design approach is to adopt a bi-level reflector geometry, in which lower, side concave reflectors transmit solar rays to lower, central mirrors, and then upward to the line of solar cells.

To be practical and effective, the solar panel system must have an accurate sun-following linkage arrangement connecting each of the pivoted L.P.R.'s, so that the solar rays are kept closely parallel to the L.P.R.'s vertical centerline for uniform solar reflective concentration during each sunlit day.

The L.P.R. panel length should be kept as short as possible up to a maximum of about twenty feet to provide convenient and accurate linkage displacement control, and to minimize the counter affects of wind gusts and non-uniformly loading on the L.P.R. panels. Mirrored surfaces are a must for the L.P.R. panels.

It will be necessary to keep the L.P.R. panels clean and clear of leaves, twigs, and debris at all times, so that the highly reflective surfaces are not obstructed. The accumulation of dust, soot dirt and oil films on the reflective surfaces L.P.R. panels will substantially cut down on the light and heat intensity received by the solar cells and flash boiler pipe at the central focal zone.

SUMMARY OF THE INVENTION

The solar power system using high concentration reflective solar panels has been evolved from the necessity of greatly increasing solar power conversion per square foot of exposure area and reducing the total cost of the system installation.

The system design invovles the utilization of conventional solar water heating components and known solar ray concentration techniques. The power system may provide electrical power using silicon photovoltaic cells, or by way of a dual conversion method in which the same focused solar rays are also used to heat hot water into steam for driving a steam engine and alternator.

The key component in the power system are the linear parabolic reflectors (L.P.R.'s), which collect and concentrate the solar rays onto a central focal strip of silicon solar cells, with a minimum concentration ratio of 10:1. This means that the width of the L.P.R.'s must be at least ten times as wide as the focal strip of solar cells to achieve the concentration of the solar rays. Because conventional L.P.R.'s have a generally shallow cross-section and reflect and concentrate solar rays at and below the linear apex or focal line, only a limited concentration ratio can be achieved. The shallow cross-section does not allow structural rigidity over long panel lengths, making it necessary to include a rigid backing structure for long solar collection reflection panels.

The present type of L.P.R. panels corrects both of these design shortcomings of the conventional type of linear parabolics, and because they are open, house-gutter-like sections they can be inexpensively fabricated on low-cost, accurate wooden forms.

The improved features for these new, present L.P.R's are produced by adding concave, reflective side sections to the basic lower parabolic cross-section, (above the linear focal zone of the basic parabola.) This type of panel section can be considered as the "tri-quadrant" configuration, since the two normal lower quadrants of the basic parabolic section are used along with an approximate half quadrant on either side of the parabolic section, but above the focal line of the section.

In the all electric version of the high-concentration linear-solar panels, a continuous line(s) of silicon solar voltaic cells are located at the linear focal zone to receive the concentrated solar rays. The line(s) of solar cells may be placed back-to-back, facing upward and downward depending on the specific geometry and end application of the power system.

The all electric linear solar panels are of the bi-level type in which a basic parabolic reflector section, with a central open slot is fitted with lower, side outer concave reflectors, which reflect solar rays onto a central, lower set of angular mirrors, which in turn reflect the solar rays upward through the open slot and directly the lower line of solar cells.

The continuous line(s) of solar cells are supported by strip-sections which are secured to uniformly placed partitions which also serve as stiffening members for the builtup L.P.R. panels.

For the dual conversion system, a horizontal flash boiler pipe of between ½" and 1" inside diameter is placed within the linear focal zone to receive a portion of the concentrated solar rays from above and below the linear focal centerline. An additional line of solar cells may be placed directly above the flash boiler pipes for additional direct solar conversion, at direct exposure with no concentration.

In the dual conversion arrangement, the generally horizontal, flash boiler pipes serve as the pivotal support for the L.P.R. panels and solar cell strip arrays, which must oscillate as a unit. Small diameter wire loops are used as the pivoting means for the L.P.R. panels, and these are securely fixed to each panel partition.

In the all electric type of direct conversion system, the L.P.R. panels are supported by pivots at the panel end partitions which are fitted into fixed trunnion brackets mounted on an open framework, similar to the dual conversion arrangement.

The sun following linkage, previously described consists of the connection of simple longitudinal rods with vertical links on each end of the L.P.R. panels. A connecting rod on each of the two longitudinal rods is connected to a timing unit which provides equal time-displacement motion increments to the longitudinal rods.

For the dual solar conversion system, several conventional solar water pre-heating, water heating and boiler units are utilized, from which the generated steam is used to drive a suitable steam engine, which in turn drives a conventional 110 volt alternator of approximately 11 to 12 KW rating, for nearly full house power requirements.

The complete solar conversion system with a total solar exposure area of approximately 750 square feet will provide full independent house power, including air conditioning provisions, at an estimated 15 horsepower for 11 KW. (11,000 watts per hour of electrical power sufficient for an average size one-family house.

Three water heating stages are required for the dual system, one for water warming from the cold house supply or well, to about 80 degrees F., and this warmed water is then fed into multiple, conventional rooftop water heating units for heating the water to about 135 degrees F., with this hot water pumped into the final multiple flash boiler pipes for heating to about 220 degrees F. (steam), necessary to drive the moderate horsepower steam engine which drives the house alternator.

The L.P.R. panel and matching flash boiler pipe design arrangement is flexible in the selection of relative sizes for these components for each specific installation. A relatively large, 50:1 ratio L.P.R. panel may be matched with a minimum ½" boiler pipe to reduce boiling time and the individual pipe lengths, but many of these L.P.R.'s and pipes may be required for a given stem flow rate. On the other hand, a moderate 20:1 L.P.R. panel may be matched to a maximum 1" diameter boiler pipe fo much greater looped length, with fewer of these lengths required for an equivalent steam flow rate as in the first example.

Each individual house rooftop type and useable surface area will determine relative proportions needed to balance between the L.P.R. panels and matching flash boiler pipe size for optimum performance. The specific house installation type and area will also dictate the relative balance of power output between the direct electric conversion and indirect water-steam power conversion means of the dual power method.

The compartitive costs for the all electric and the water-to-steam conversion methods are unknown at this time, but will have a direct bearing on the final balance between the two conversion means for each household installation.

Although the L.P.R. panel lengths may be up to about thirty feet long for some installations, the individual panel sections may be fabricated in about five foot lengths for manufacturing convenience, which are then joined with formed metal connectors to produce the final panel length required for each specific power system installation.

The L.P.R. panels are molded of several layers of fiberglass epoxy resin on accurate, uniformly linear parabolic forms, with highly reflective metal foil surfaces bonded to the inside formed panel surfaces. External ribs and longitudinal stringers are added as reinforcements for the L.P.R. panels to increase their structural integrity and stiffness.

The assembled solar panels are mounted on a rooftop, or similar raised structure with the pivoting ends facing generally north and south, so that all the panels oscillate east-to-west during the day, and then return to the next day's reset position during the night.

The solar panels should have a slight southerly slope for optimum solar exposure, and to aid in displacing the hot water through the flash boiler pipes of the dual conversion system.

As the solar conversion system design evolves it may be found that an all electric conversion means alone is not practical because of the high heat dissipation requirement of the heated solar cells. In this case the cooling water for the heated solar cells will become the first water heating stage of a dual conversion arrangement. More than a single pipe may be required for cooling, with two or three small tubing runs found suitable. Subsequent hot water to steam heating stages will be required by additional high concentration tri-quadrant panels.

Variations may be made in the positioning, type and number of solar cells used in both types of panel geometries such as placing additional solar cells on the top of the continuous line of cell 11s facing downward in the all electric type of panels, or adding solar cells on the top of the flash boiler pipes in the dual type of solar panel. The less expensive bi-metal thermocells may be used at these locations as an auxiliary power source for the inter-stage pumps and the timing motor.

It is a principal object of the invention to create a solar energy conversion system which uses a substantially reduced number of solar cells to produce electrical power for approximately one half to full house-power requirements within the existing roof surface area of a house.

It is a further object of the invention to provide a dual solar conversion system wherein an indirect steam-to-electric conversion means is available as a secondary power source.

Other objectives and means of the invention have been previously described in the summary portion of these specifications. It should be understood that changes and variations may be made in the detail design of the high concentration, reflective solar panels, without departing from the spirit and scope of the invention as specified.

Several Disclosure Documents have been filed as prior informal descriptions of this solar power system.

Disclosure Documents:

(1) Solar Power System, (2) High Density, Reflective Solar Panels (3) High Concentration, Linear Solar Panels.

DESCRIPTION OF THE PREFERRED EMBODIMENT (FIGS. 3 AND 4)

Figure 1:
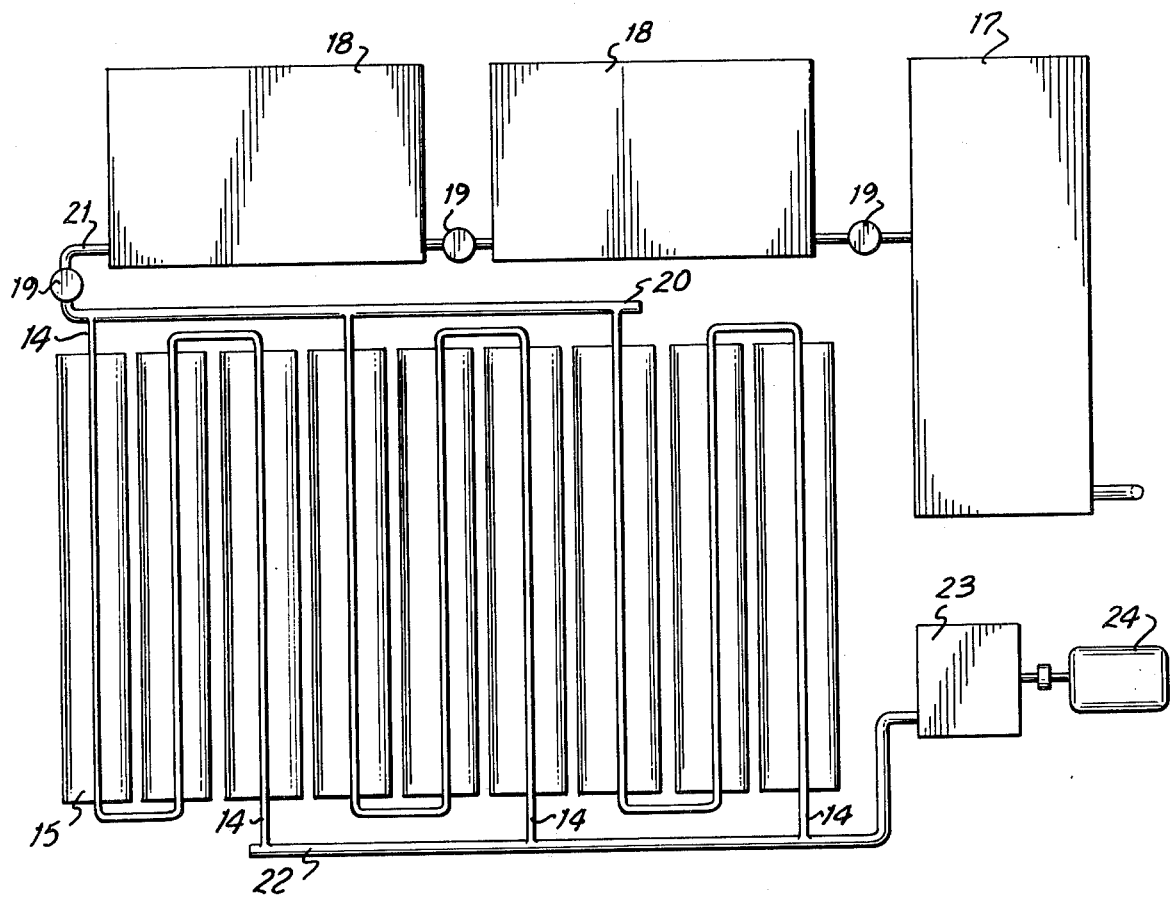
FIG. 1 is a plan view of the dual type of solar conversion system.
Figure 2:
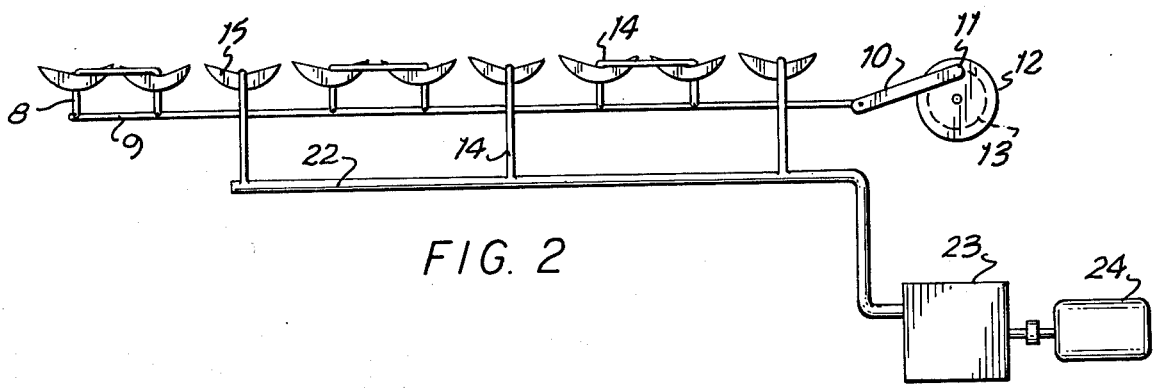
FIG. 2 is an elevation view of the dual type of solar conversion system.
Figure 3:
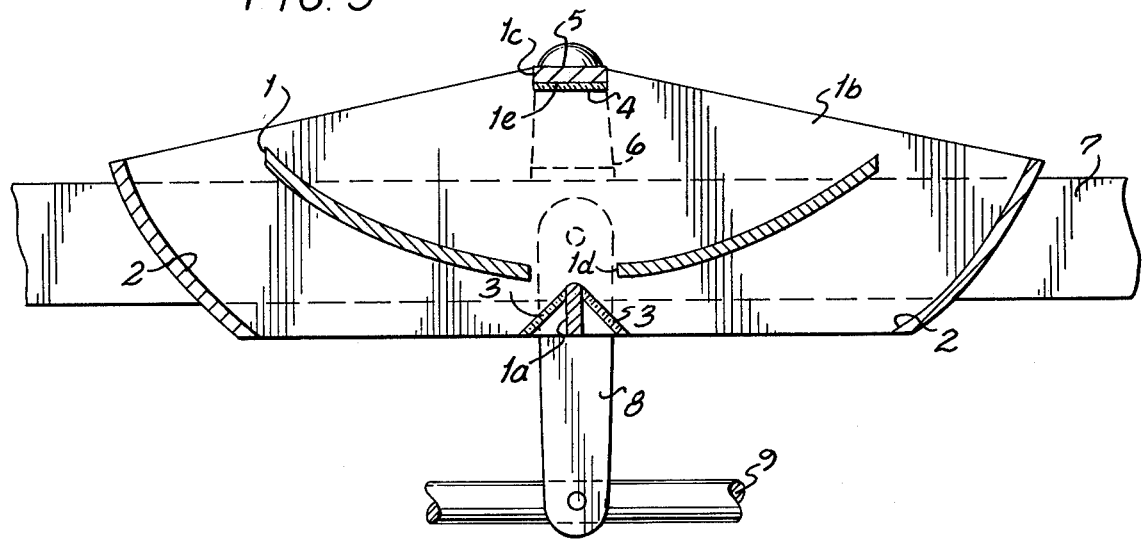
FIG. 3 is a cross-section of a dual conversion, tri-quadrant, linear solar panel.
Figure 4:
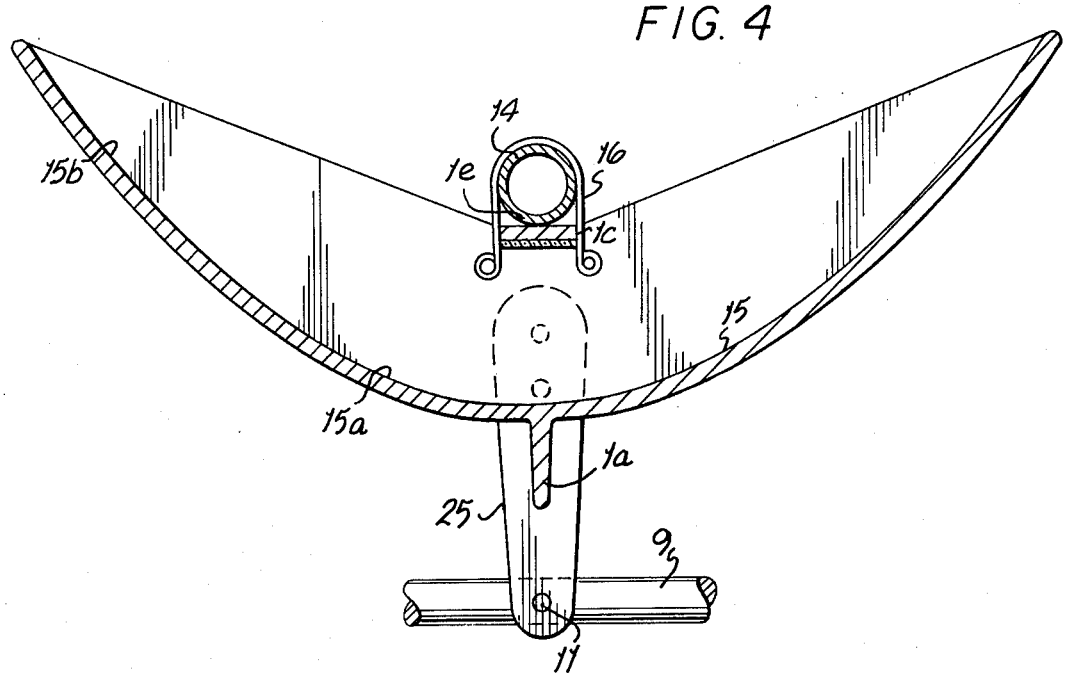
FIG. 4 is a cross-section of an all-electric, -bi-level high concentration linear solar panel.
Figure 5:
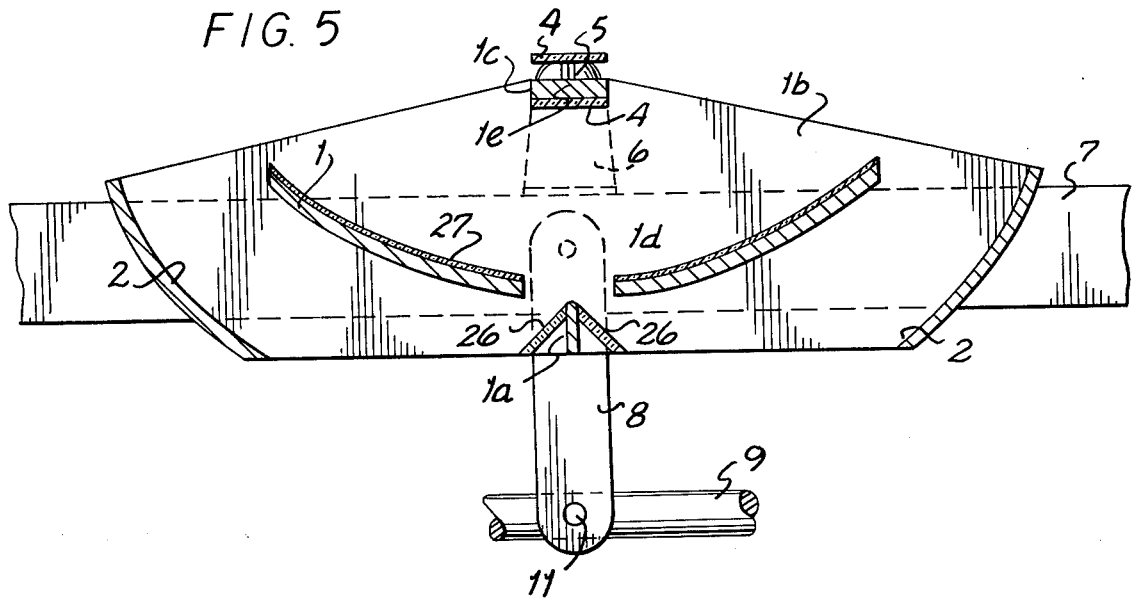
FIG. 5, is an alternate cross-section of a dual conversion, tri-quadrant, linear solar panel.
Figure 6:
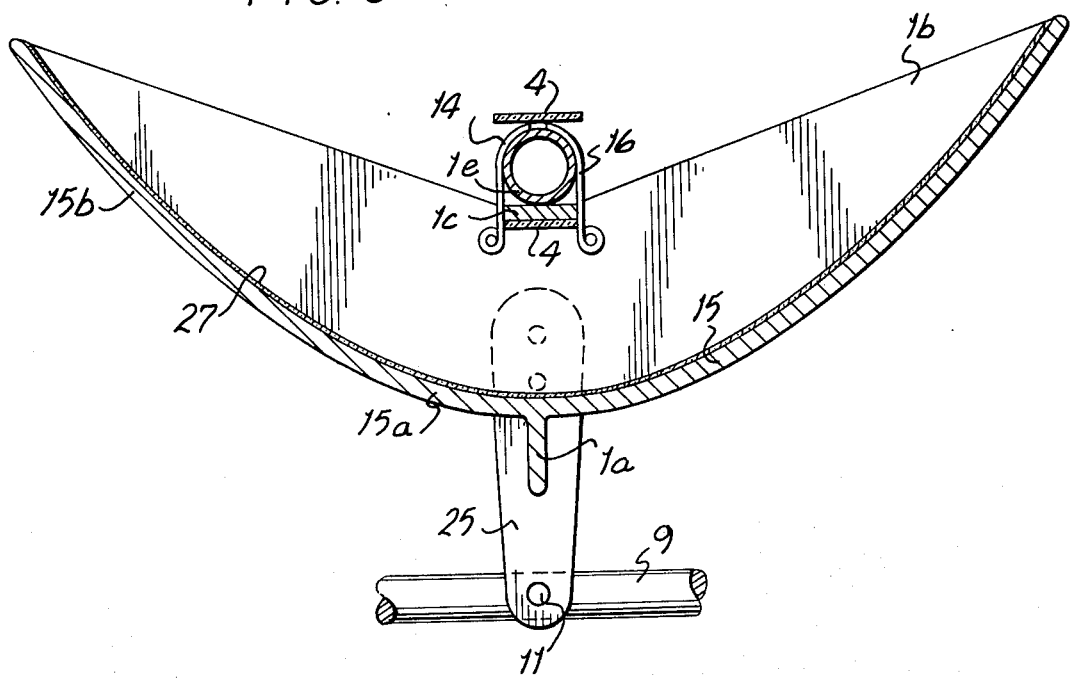
FIG. 6 is an alternate cross-section of an all electric, -bi-level high concentration linear solar panel.

The solar power system using high concentration, reflective, solar panels of the linear parabolic type is comprised of linear parabolic reflective solar panel 1, which must have a mirrored, or thin mirror segments on the inside concaved surfaces, and be reenforced by vertical, lower stringer 1a, partitions 1b, and support strip 1c.

Two lower, angular mirrors or reflectors 3, are secured to the vertical. lower stringer 1a, which reflects solar rays upward through the slot 1d, which is centrally located at the bottom of the solar panel 1.

A continuous line of adjacent silicon photovoltaic solar cells 4, are affixed to the underside of the support strip 1c. between the partitions 1b, which are within the linear focal zone 1e.

Two lower, side concave mirrored reflectors 2, are secured to the uniformly located partitions 1b, of the solar panel.

Panel pivots 5, are located at the ends of each solar panel 1, which are centered on the linear focal line of the parabola forming the solar panels 1.

The panel pipes 5, are fitted into trunnion brackets 6, at each end which are secured to an open rigid framework 7, with suitable hardware.

Vertical links 8, which project downward are secured to the ends of each solar panel 1, which are connected to two longitudinal rods 9, so that all of the solar panles 1, will oscillate together. The two longitudinal rods 9, are connected at the same end to two connecting links 10, by means of the pivot pins 11. The two connecting links 10, are pivotally connected to two timing discs 12, by the pivot pins 11.

The timing discs 12, are rotated by the timing motor 13, which makes one full revolution every twenty-four hours. The linkage geometry is compensated to provide equal time displacement increments from the sinusoidal rotation of the timing motor 13.

The previously described arrangement is for the direct, all electric system using bi-level high concentration reflective mirror solar panels.

The dual solar conversion system is based on some of the previously described components with the addition of a central flash boiler pipe 14, which forms the pivotal support for the solar panels 15.

A more suitable and effective solar panel 15, of the tri-quadrant concept is best matched with the flash boiler 14, to produce solar concentration in two dimensions. The tri-quad solar panel 15, consists of a basic parabolic section 15a, and additional concave reflective sections 15b, which provide solar ray concentration on the sides of the flash boiler pipe 14, above the normal parabolic focal line.

Multiple wire loops 16, pivotally support the solar panels 15, on the multiple flash boiler pipes 14.

The dual solar conversion arrangement requires that several water heating units be utilized which will consist of a solar water warming reservoir 17, which receives cold water from the house supply or well. The water warming reservoir 17, is then connected to one or more conventional solar water heating units 18, which further heat the warm water.

Inter-stage water pumps 19, between the units insure that a cotinuous water flow is supplied to the flash boiler pipes 14. The number of flash boiler pipes 14, is flexible, and based on each specific power installation, and these are connected to the header cross pipe 20, which is connected with the supply pipe 21, from the water heater units 18, on the water supply side.

A steam header cross pipe 22, connects all the steam ends of the flash boiler pipes 14, directly with the steam engine 23, which may be of the piston or newer simplified rotary type. The steam engine 23, is directly coupled to a 110 volt electric alternator 24, as the system's power source.

The tri-quadrant solar panels 15, are also oscillated by the same linkage arrangement as for the bi-level solar panels, with the vertical links 25, secured to each end of the solar panels 15.

In an alternate arrangement a continuous line of adjacent solar cells 4, may be included above the existing solar cells 4, of the bi-level solar panels 1, and the flash boiler pipes 14, of the tri-quad, dual solar panels 15.

Another variation which may be an improvement for the bi-level panel 1, is the substitution of squarish or rectangular reflective solar cells 26, for the two, lower, angular mirrors 3, so that both direct conversion and some reflection of solar rays may be usefully applied.

The high concentration, reflective solar panel surfaces of both types 1 and 15, may be fitted with uniformly narrow mirror-segments 27, instead of a continuous curved mirror surface to possibly lower the cost of these surfaces.

What is claimed is:

1. A solar power system with multiple high concentration reflective solar panels formed of linear parabolic reflectors with mirrored surfaces,
   each of said multiple high concentration reflective solar panels is reinforced with a longitudinal support strip and stringer with cross partitions at uniformly spaced intervals,
   two lower side concave elongate mirrors secured to said cross partitions at uniformly spaced intervals,
   two lower angular mirrors centrally secured to said longitudinal stringer,
   centrally disposed longitudinal slots within said high concentration reflective solar panels between said cross partitions,
   a continuous line of photovoltaic solar cells affixed to the underside of said longitudinal support strip,
   end pivots located at the ends of said multiple high concentration reflective solar panels centered on the focal line of said linear parabolic reflectors,
   each of said end pivots fitted into trunnion brackets secured to an open rigid framework with suitable hardware.

2. A solar power system with multiple high concentration reflective solar panels according to claim 1, in which said multiple high concentration reflective solar panels are fitted with vertical links at each end,
   connection of the ends of said vertical links to two longitudinal rods by means of multiple pivot pins and retaining rings,
   two short connecting links connected to each of said two longitudinal rods by means of two pivot pins and retainig rings,
   two timing discs rotated one revolution every twenty four hours by an electric timing motor,
   connection of said two short connecting links to said two timing disces by means of two pivot pins and retaining rings,
   motion compensation of said connecting links to provide equal time-displacement increments to said multiple high concentration reflective solar panels.

3. A solar power system with multiple high concentration reflective solar panels according to claim 1, in which the assembled said solar power system is disposed on a house rooftop with a southerly slope,
   uniform oscillation of all of said multiple high concentration reflective solar panels in a nearly true east-to-west direction during the day,
   return of all of said multiple high concentration reflective solar panels to the next day's east reset position during the night,
   motion correction of all of said multiple high concentration reflective solar panels for true sun-following timing and orientation by means of timing motor speed control.

4. A solar power system with multiple high concentration reflective solar panels according to claim 1, wherein said mirrored surfaces are comprised of multiple narrow mirror segments in close lateral contact secured to said linear parabolic reflectors,
   said two lower side concave elongate mirrors secured to said cross partitions are composed of multiple narrow mirror segments in close lateral contact and securely affixed,
   said multiple high concentration reflective solar panels are formed of built fiberglass epoxy layers on an open linear mold,
   a smooth continuous curved surface on the inside of said multiple high concentration reflective solar panels,
   construction of said multiple high concentration reflective solar panels of any convenient length,
   joining of said multiple high concentration reflective solar panels with formed metallic slip joint connectors at uniform lengths.

5. A solar power system with multiple high concentration reflective solar panels formed of a single linear parabolic reflector and concave outer sections with mirrored surfaces,
   said concave outer sections extend above the normal focal line of said linear parabolic reflector on both sides of said linear parabolic reflectors, each of said multiple high concentration reflective solar panels is reinforced with a longitudinal support strip and stringer with cross partitions at uniformly spaced intervals,
   a continuous line of photovoltaic solar cells affixed to the underside of said longitudinal support strip, multiple flash boiler pipes disposed on a parallel axis to said multiple high concentration reflective solar panels directly above said longitudinal support strip, multiple wire loops disposed over said multiple flash boiler pipes secured to each of said cross partitions at uniformly spaced intervals.

6. A solar power system with multiple high concentration reflective solar panels according to claim 5, including multiple water warming and heating units connected in a series water flow path with said multiple flash boiler pipes, inter-stage water pumps between said water warming and heating units with connecting pipes, connection of said water warming unit with a suitable cold water supply source, a header cross pipe connecting all of the parallel said multiple flash boiler pipes with the last of said water heating units connected in a series water flow path, a steam header cross pipe connecting all of the parallel said multiple flash boiler pipes at the opposite end from said header cross pipe, said steam header cross pipe is directly connected with a a suitably matched steam engine, direct coupling of said steam engine with a 110 volt A.C. electric alternator.

7. A solar power system with multiple high concentration reflective solar panels according to claim 5, whwerein a continuous line of photovoltaic solar cells is affixed to the topside of said multiple flash boiler pipes, said multiple high concentration reflective solar panels are formed of builtup layers of fiberglass epoxy with a smooth inside surface finish, construction of said multiple high concentration reflective solar panels of any convenient linear length, joining of said multiple high concentration reflective solar panels with formed metallic slip joint connectors, forming of said multiple high concentration reflective solar panels on simple linear moldforms of low cost material.

8. A solar power system with multiple high concentration reflective solar panels according to claim 5, wherein said mirrored surfaces are comprised of multiple identical narrow mirror segments lined up edge-to-edge and secured to said single linear parabolic reflector and concave outer sections, a suitable high temperature adhesive used to affix said multiple identical narror mirror segments to said linear parabolic reflector, the assembled said solar power system is uniformly disposed on a building roof top and raised structures with a generally southerly slope, uniform oscillation of all of said multiple high concentration reflective solar panels in a nearly true east-to-west direction during the day, return of all of said multiple high concentration reflective solar panels to the next day's east reset position during the night, motion correction of all of said multiple high concentration reflective solar panels for true sun following characteristics by means of timing motor speed control, said multiple high concentration reflective solar panels having a minimum concentration ratio of 10:1 and a maximum concentration ratio of 50:1.

* * * * *